United States Patent [19]

Ohta

[11] Patent Number: 5,134,317
[45] Date of Patent: Jul. 28, 1992

[54] BOOSTER CIRCUIT FOR A SEMICONDUCTOR MEMORY DEVICE

[75] Inventor: Yoshiji Ohta, Yamatokoriyama, Japan

[73] Assignee: Sharp Kabushiki Kaisha, Osaka, Japan

[21] Appl. No.: 705,618

[22] Filed: May 29, 1991

[30] Foreign Application Priority Data

May 31, 1990 [JP] Japan ................................ 2-143046

[51] Int. Cl.⁵ ............................................. H03K 19/01
[52] U.S. Cl. ..................................... 307/482; 307/269; 307/270; 365/203
[58] Field of Search ................ 365/203; 307/481, 482, 307/269, 270, 264

[56] References Cited

U.S. PATENT DOCUMENTS

| | | | |
|---|---|---|---|
| 4,484,092 | 11/1984 | Campbell | 307/482 |
| 4,503,522 | 3/1985 | Etoh et al. | 365/203 |
| 4,677,313 | 6/1987 | Mimoto | 307/270 |
| 4,678,941 | 7/1987 | Chao et al. | 307/449 |
| 4,704,706 | 11/1987 | Nakano et al. | 307/482 |
| 4,906,056 | 3/1990 | Taniguchi | 307/482 |

*Primary Examiner*—David Hudspeth
*Assistant Examiner*—Andrew Sanders
*Attorney, Agent, or Firm*—Nixon & Vanderhye

[57] ABSTRACT

The secondary side of a control capacitor is charged, prior to the precharge period, almost to the source voltage level by a dummy cycle performed after power-on. Then, during the precharge period, a control circuit charges the control capacitor to increase the potential of its primary side to a level higher than the source voltage level $V_{cc}$. The potential of the gate of the first transistor is increased to a level higher than the source voltage level, which causes the first transistor to turn on to charge a booster capacitor. At this time, since the secondary side of the booster capacitor is grounded through a third transistor, the primary side of the booster capacitor is held at the source voltage level. When the active period is entered, the third transistor is turned off, and a second transistor which is connected between the power source and the booster capacitor is turned on. This causes the potential of the secondary side of the booster capacitor to rise to the source voltage level. The control circuit operates to ground the control terminal of the first transistor so that the first transistor is turned off, thereby increasing the potential of the primary side of the booster capacitor to a level higher than the source voltage level. The signal of the level higher than the source voltage level is output from the output terminal through a fourth transistor.

6 Claims, 4 Drawing Sheets

BOOSTER CIRCUIT FOR A SEMICONDUCTOR MEMORY DEVICE

BACKGROUND OF THE INVENTION

1. Field of the Invention

This invention relates to a booster circuit for a semiconductor memory device such as a dynamic random access memory (DRAM).

2. Description of the Prior Art

A high-density DRAM is designed so that some kinds of signals such as a word line drive signal, etc. have a voltage level which is higher than the level of the source voltage (hereinafter, referred to as "source voltage level"), in order to improve the operating allowance and other characteristics. Such a voltage level higher than the source voltage level is generated by a booster circuit provided in the DRAM chip. FIG. 5 shows an example of a prior art booster circuit. The booster circuit of FIG. 5 is disclosed in U.S. Pat. No. 4,677,313.

The operation of the booster circuit of FIG. 5 will be described with reference to FIG. 6. During the precharge period, the precharge signal $\phi_p$ is HIGH ((a) of FIG. 6), and MOS transistors 28, 29, 30 and 36 are on, so that an output signal $\phi_{out}$, nodes B and D are held at the ground level ((e) and (f) of FIG. 6). A node C is precharged to a high level ($V_{cc}$), and MOS transistors 22 and 25 are off. A booster MOS capacitor 31 is precharged during the precharge period through a MOS transistor 21 which is connected to the source voltage $V_{cc}$. The precharge voltage of the booster MOS capacitor 31 (i.e., the voltage level of a node A) is $V_{cc}-V_{th}$ (where $V_{th}$ is the threshold value of the MOS transistor 21), as shown in (d) of FIG. 6.

The precharge period is followed by the active period during which the precharge signal $\phi_p$ drops to the ground level and an input signal $\phi_{in}$ of the source voltage level $V_{cc}$ is input ((b) of FIG. 6). This causes a MOS capacitor 32 to be charged through a MOS transistor 23. The delay time of a delay circuit 20 is selected so that the MOS capacitor 32 is sufficiently charged. As shown in FIG. 6, when the input signal $\phi_{in}$ is LOW, the output of the delay circuit 20 is HIGH, and vice versa. The potential of a node C is held at a high level ($V_{cc}$) by the delay operation of the delay circuit 20 until the MOS capacitor 32 is charged to a sufficient degree, so that the levels of the output signal $\phi_{out}$ and node D are held at a low level. The gate of a MOS transistor 35 is boosted through a MOS capacitor 38 to a level higher than the source voltage level $V_{cc}$, so that a current flows into the node A via the MOS transistor 35, thereby compensating the above-mentioned potential drop. Because of this operation, the MOS capacitor 32 is sufficiently charged. When the delay time of the delay circuit 20 has elapsed, the level of the node C drops, and the MOS capacitor 38 is discharged through the MOS transistor 37 to lower the potential of the node E, resulting in the turn off of the MOS transistor 35.

When the delay time of the delay circuit 20 has elapsed (i.e., when the MOS capacitor 32 has been sufficiently charged), the MOS transistors 24 and 26 are turned off, and the potential of the node D begins to rise up to the source voltage level $V_{cc}$. In the case of no-load, therefore, the potential of the node A which is capacitively coupled to the node D is raised from $V_{cc}$ to $2 V_{cc}$ with the increase of the potential of the node D, causing the level of the output signal $\phi_{out}$ to be boosted via the MOS transistor 22. The MOS capacitor 32 boosts the potential of the gate (node B) of the MOS transistor 22 to a higher level. As a result, the output signal $\phi_{out}$ having a level higher than the source voltage level $V_{cc}$ is generated. The level of the output signal $\phi_{out}$ reaches a value as high as $2 V_{cc}$ when the load of the output signal $\phi_{out}$ is null. Since the above-mentioned series of operations is rapidly performed as soon as the potential of the node D begins to rise, the circuit of FIG. 5 functions as a relatively fast booster circuit.

In the circuit of FIG. 5, however, the potential of the node A is lower than the source voltage level $V_{cc}$ during the precharge period, and is raised to the source voltage level $V_{cc}$ by the MOS transistor 35 after the rising of the input signal $\phi_{in}$. This causes a problem in that it requires a considerably long period of time to fully charge the MOS capacitor 31, resulting in that the total period of time required for the boost operation becomes longer.

SUMMARY OF THE INVENTION

The booster circuit for a semiconductor memory device of this invention, which overcomes the above-discussed and numerous other disadvantages and deficiencies of the prior art, comprises: a booster capacitor; first switch means connected between a power source and the primary side of said booster capacitor; second switch means connected between the power source and the secondary side of said booster capacitor; third switch means connected between the ground and said secondary side of said booster capacitor; fourth switch means connected between an output and said primary side of said booster capacitor; and an output terminal for outputting the potential of said primary side of said booster capacitor, and said booster circuit further comprises a control circuit having an output which is connected to the control terminal of said first switch means, said control circuit comprising: a control capacitor, the primary side of said control capacitor being connected to said output of said control circuit; fifth switch means connected between the ground and said output of said control circuit, said control capacitor being charged during a precharge period of said memory device to apply a potential higher than the level of said power source to said output of said control circuit, said fifth switch means being turned on during an active period of said memory device in order to turn off said first switch means.

In the booster circuit according to the invention, the secondary side of the control capacitor is charged, prior to the precharge period, almost to the source voltage level by a dummy cycle, etc. performed after power-on. Then, during the precharge period, the control circuit charges the control capacitor, to increase the potential of its primary side to a level higher than the source voltage level. As a result, the potential of the control terminal of the first switch means is increased to a level higher than the source voltage level, which causes the first switch means to turn on the charge the booster capacitor. At this time, since the secondary side of the booster capacitor is grounded through the third switch means, the primary side of the booster capacitor is held at the source voltage level.

Next, when the active period is entered, the third switch means is turned off, and the second switch means is turned on. This causes the potential of the secondary side of the booster capacitor to rise to the source voltage level. The control circuit operates to ground the control terminal of the first switch means so that the first switch means is turned off, thereby increasing the potential of the primary side of the booster capacitor to a level higher than the source voltage level. The signal of the level higher than the source voltage level is output from the output terminal via the fourth switch means.

According to the invention, since the potential of the booster capacitor is raised to the same level as the source voltage level during the precharge period, the period of time required for the boost operation during the active period is shortened.

In a preferred embodiment, said booster capacitor and control capacitor are MOS capacitors.

In a preferred embodiment, said first to fifth switch means are MOS transistors.

In a preferred embodiment, said first to fifth switch means are MOS transistors, and said control terminal is a gate of said MOS transistor.

In the above-described configuration, when the semiconductor memory device is powered on, the control capacitor has not yet charged. When the booster circuit is used in a semiconductor memory device in which a dummy cycle is not performed, therefore, it is not possible to increase the potential of the booster capacitor to the same level as the source voltage level during the first precharge period after the power-on (hereinafter, referred to merely as "first precharge period").

When the booster circuit according to the invention is used in such a semiconductor memory device, it further comprises initializing means for charging said control capacitor when the power on operation of said semiconductor memory device is performed.

Preferably, said initializing means comprises an OR gate, said OR gate having an input to which a reset signal is supplied.

In the other booster circuit according to the invention, therefore, the control circuit is provided with initializing means for initializing the charge condition of the control capacitor in response to an initialization signal, so that the charge condition of the control capacitor can be initialized by inputting the initialization signal to the control circuit before entering the precharge period. This enables the potential of the booster capacitor to be always increased to the same level as the source voltage level during the precharge period. Even when the first precharge after the power-on is to be performed, therefore, the potential of the booster capacitor is surely raised to the same level as the source voltage level during the first precharge period.

Thus, the invention described herein makes possible the objectives of:

(1) providing a booster circuit for a semiconductor memory device which operates very rapidly;

(2) providing a booster circuit for a semiconductor memory device in which the period of time for the boost operation can be shortened; and (3) providing a booster circuit for a semiconductor memory device in which the node A can be charged up to the source voltage level $V_{cc}$ during the precharge period.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
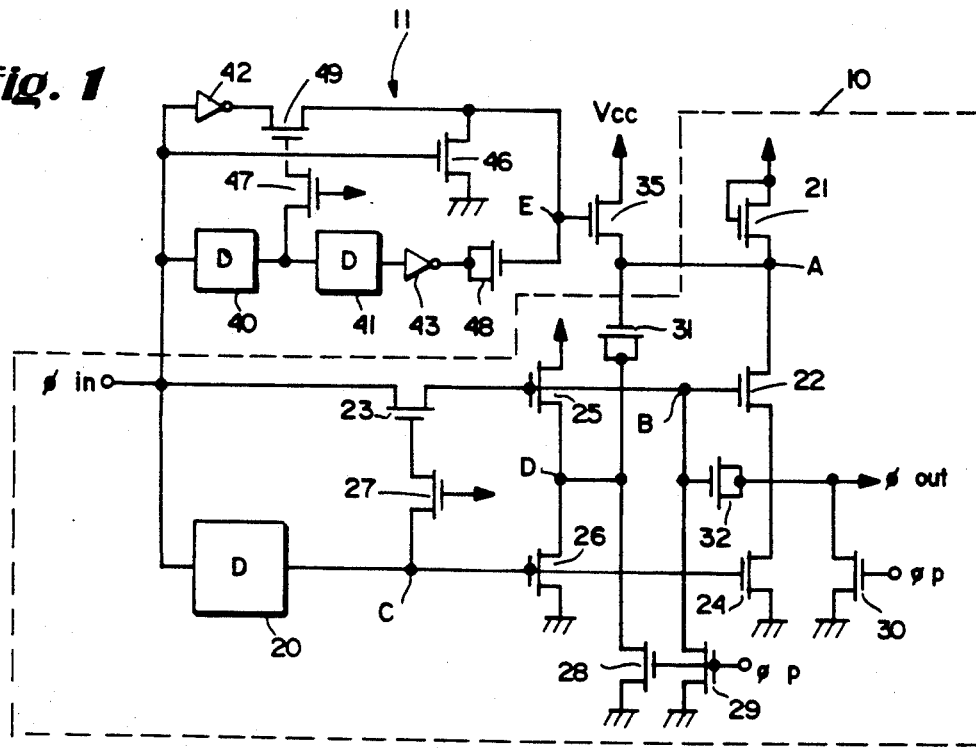
FIG. 1 is a circuit diagram showing a booster circuit according to the invention.
Figure 5:
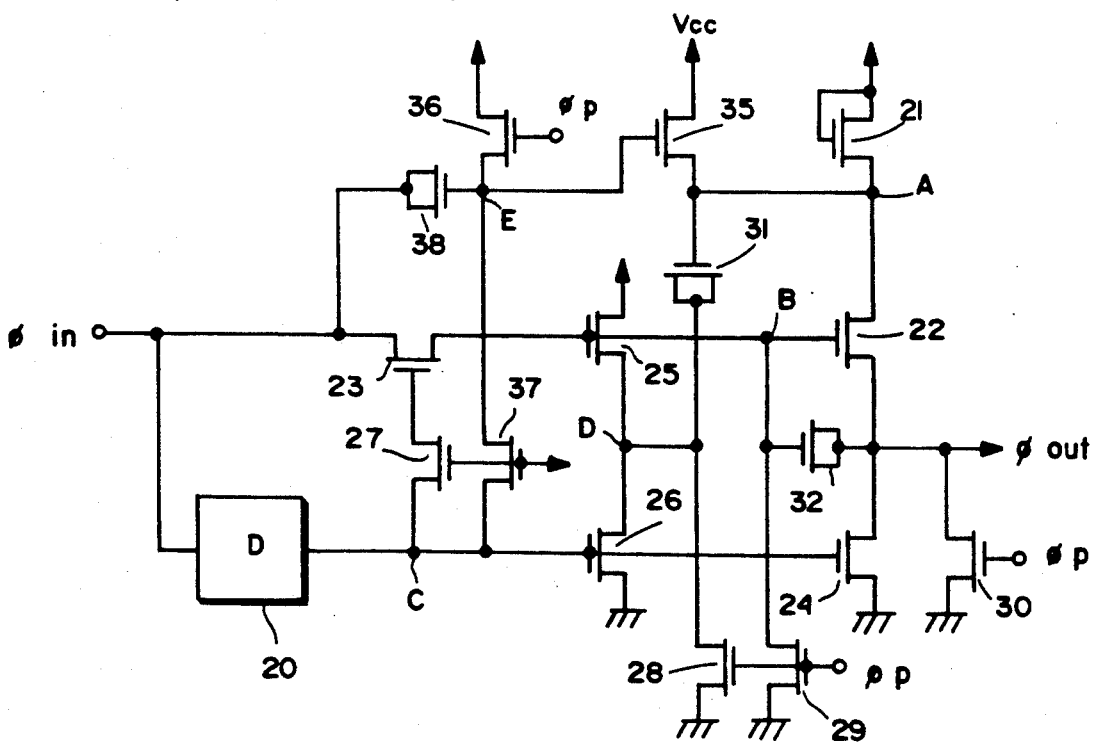
FIG. 5 is a circuit diagram showing a prior art booster circuit.
Figure 6:
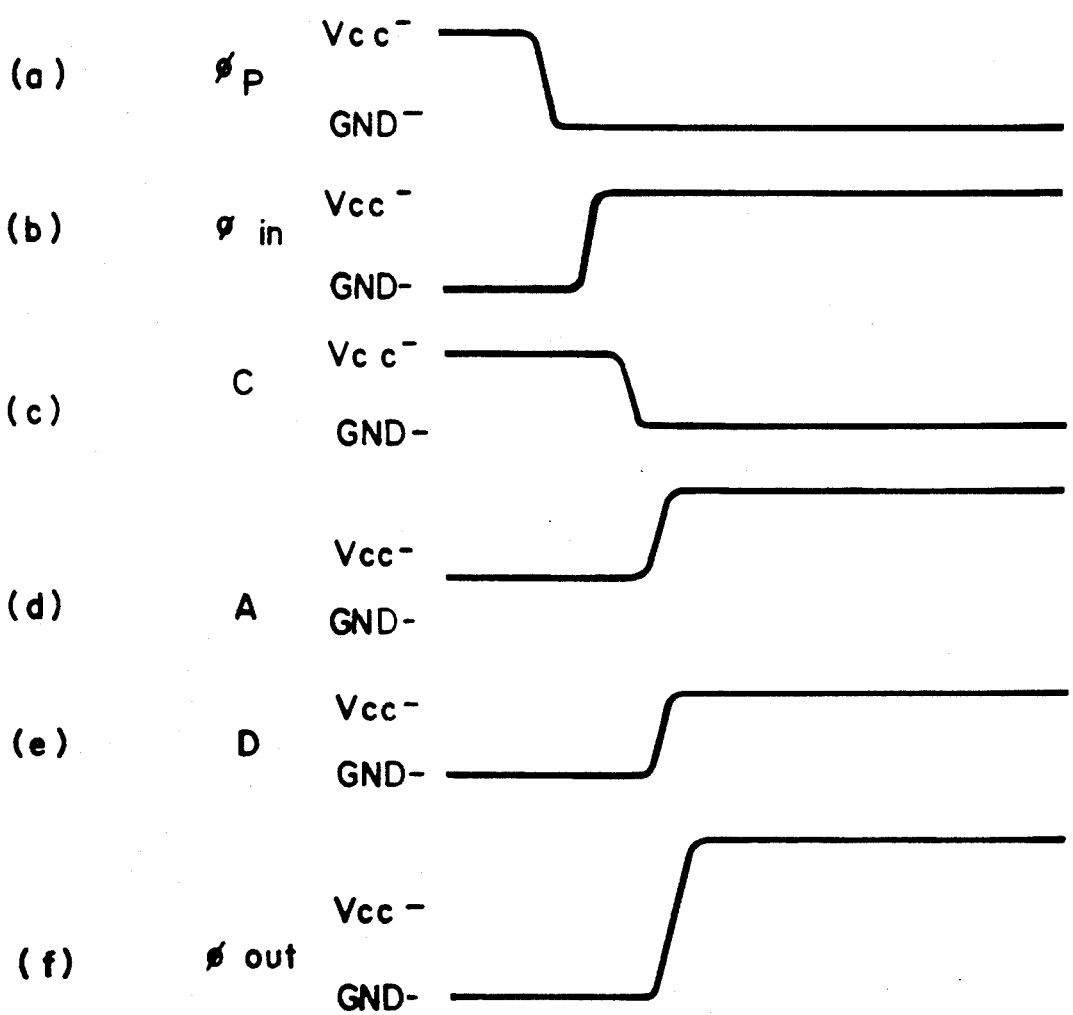
FIG. 6 is a timing chart illustrating the operation of the booster circuit of FIG. 5.

FIG. 1 illustrates a booster circuit according to the invention. The booster circuit of FIG. 1 is used in a DRAM, and comprises the same circuitry as that shown in FIG. 5 except that a control circuit 11 is provided and that the MOS transistor 37 is not formed. In FIG. 1, the portions having the same structure as those in the booster circuit of FIG. 5 are enclosed by a broken line. Hereinafter, such portions are generally referred to as "the booster portion 10". The control circuit 11 comprises delay circuits 40 and 41, inverters 42 and 43, MOS transistors 46, 47 and 49, and a MOS capacitor 48. The two delay circuits 40 and 41, the inverter 43, and the MOS capacitor 48 are connected in series. The inverter 42 and the MOS transistor 49 are connected in series. The MOS transistor 47 is connected between the gate of the transistor 49 and the junction point of the delay circuits 40 and 41. The gate of the MOS transistor 47 is coupled to the source voltage $V_{cc}$. The inputs of the delay circuit 40 and inverter 42 and the gate of the MOS transistor 46 are connected to the input terminal of the booster circuit to which the input signal $\phi_{in}$ is supplied. The MOS transistor 49 and the primary side of the MOS capacitor 48 are connected to the gate (node E) of the MOS transistor 35. The MOS transistor 46 is connected between the node E and the ground. In a DRAM, generally, a dummy cycle during which a pulse signal is input to a RAS terminal of the DRAM is performed after the power-on operation. During this dummy cycle, the level of the input terminal is also raised, and therefore the MOS capacitor 48 is previously charged to a level substantially equal to the source voltage level $V_{cc}$.

The operation of the booster circuit of FIG. 1 will be described with reference to FIG. 2. When entering the precharge period, the input signal $\phi_{in}$ and the precharge signal $\phi_p$ are set to LOW and HIGH, respectively ((b) and (a) of FIG. 2). The output of the inverter 42 becomes HIGH, and the MOS transistor 46 is turned off, thereby causing the potential of the node E to rise to the source voltage level $V_{cc}$. After the delay time of the delay circuit 20, the potential of the node C rises to the source voltage level $V_{cc}$ ((c) of FIG. 2), and the MOS transistor 26 turns on to lower the potential of the node D to the ground level. After the delay time of the delay circuit 40, the gate potential of the MOS transistor 49 is lowered through the MOS transistor 47, and the MOS transistor 49 turns off. Hence, the potential of the node E is boosted by the MOS capacitor 48 to a level higher than the source voltage level $V_{cc}$ ((g) of FIG. 2), so that the MOS transistor 35 turns on and the MOS capacitor 31 is charged. Because the secondary side (the node D) of the MOS capacitor 31 is grounded, the potential of the primary side (the node A) of the MOS capacitor 31 becomes the source voltage level $V_{cc}$ ((e) of FIG. 2).

Figure 2:
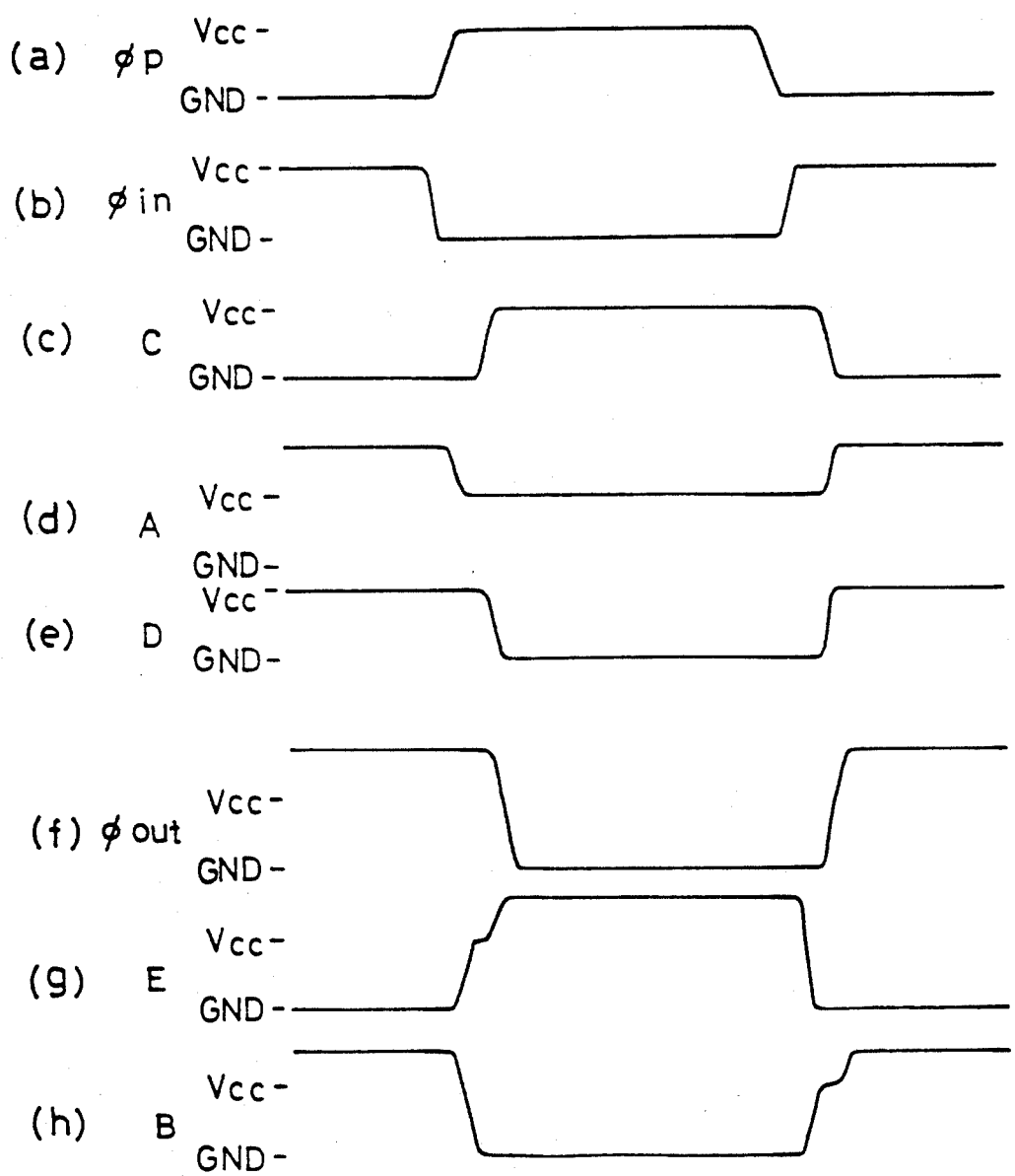
FIG. 2 is a timing chart illustrating the operation of the booster circuit of FIG. 1.

When entering the active period, the precharge signal $\phi_p$ and the input signal $\phi_{in}$ are returned to LOW and HIGH respectively as shown in (a) and (b) of FIG. 2. Then, the MOS transistor 46 turns on to lower the potential of the node E to the ground level, thereby making the MOS transistor 35 turn off. In the same manner as described with regard to the prior art circuit of FIG. 5, the potential of the node A is boosted to a level higher than the source voltage level $V_{cc}$. The above-described turning off of the MOS transistor 35 prevents the reverse current flow from the node A through the MOS transistor 35 from occurring. According to the embodiment, during the precharge period, the node A is charged to a level as high as the source voltage level $V_{cc}$. Consequently, the total period of time required for the boost operation in the booster circuit can be effectively shortened.

Figure 3:
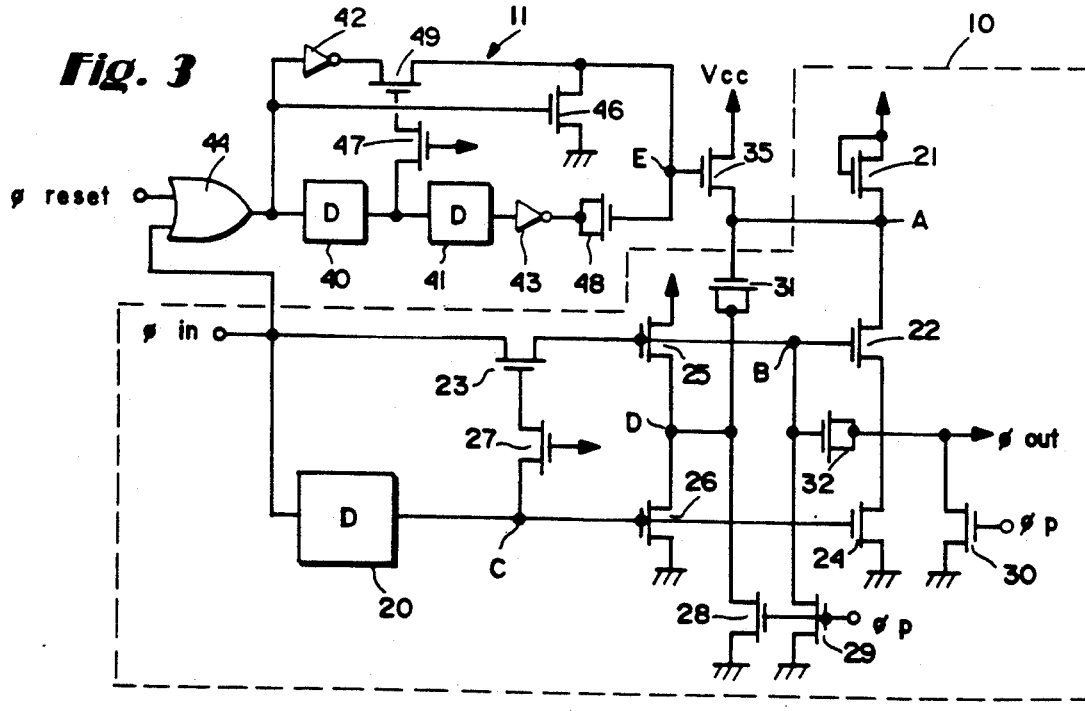
FIG. 3 is a circuit diagram showing another booster circuit according to the invention.

FIG. 3 illustrates another booster circuit according to the invention. In the booster circuit of FIG. 1, the potential of the node E is raised in the dummy cycle before the first precharge period. The booster circuit of FIG. 3 is used in a DRAM in which the dummy cycle is not performed, and has the same construction except that it is provided with a two-input OR gate 44. In a DRAM, generally, a reset signal $\phi_{reset}$ is generated. The reset signal $\phi_{reset}$ is a pulse-like signal the level of which is raised to the source voltage level $V_{cc}$ when the DRAM is powered on, and, after a predetermined time has elapsed, the level of the reset signal $\phi_{reset}$ is returned to the ground level. One of the inputs of the OR gate 44 is coupled to the input terminal of the booster circuit, and the reset signal $\phi_{reset}$ is supplied to the other input of the OR gate 44. The output of the OR gate 44 is connected to the inputs of the delay circuit 40 and inverter 42 and the gate of the MOS transistor 46.

As described above, the level of the reset signal $\phi_{reset}$ is raised to the source voltage level $V_{cc}$ when the DRAM is powered on. By this rise of the reset signal $\phi_{reset}$, the MOS capacitor 48 is charged. According to the embodiment, therefore, the potential of the node E can be surely raised to a level higher than the source voltage level $V_{cc}$ in the first precharge period.

Figure 4:
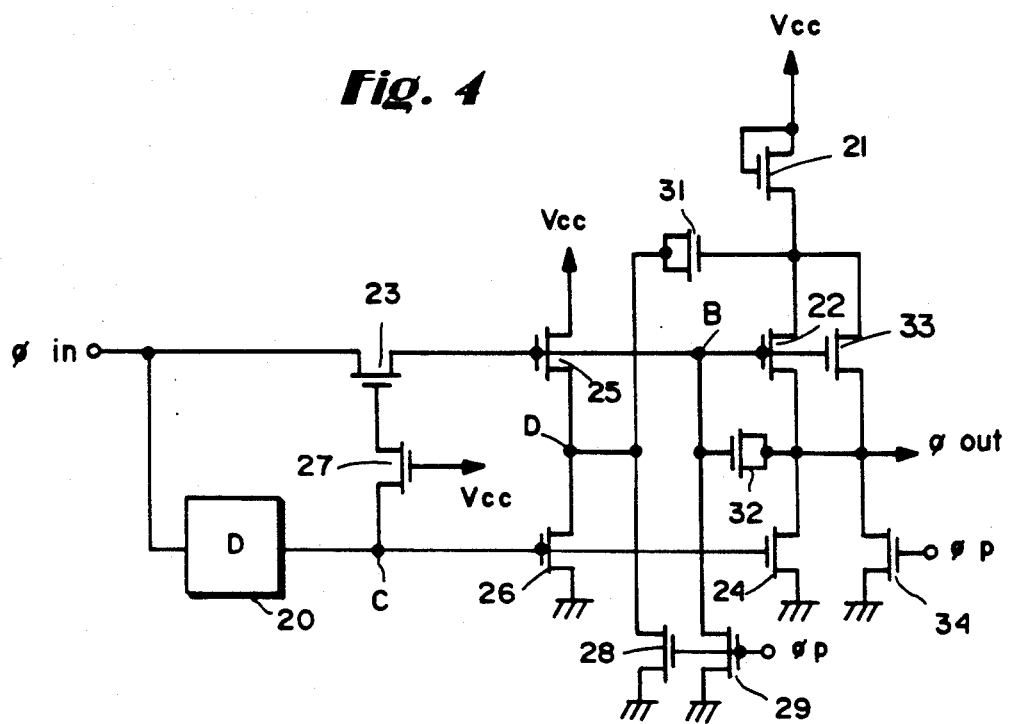
FIG. 4 is a circuit diagram partially showing a further embodiment of the invention.

According to the invention, the configuration of the booster portion 10 is not restricted to those shown in FIGS. 1 and 2, and may be adequately selected from configurations in which a booster capacitor is to be charged. FIG. 4 shows another configuration of the booster portion 10 wherein the output signal $\phi_{out}$ is obtained from the source of a MOS transistor 33.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a booster circuit for a semiconductor memory device, comprising:
   a booster capacitor;
   first switch means connected between a power source and a primary side of said booster capacitor;
   second switch means connected between the power source and a secondary side of said booster capacitor;
   third switch means connected between ground and said secondary side of said booster capacitor;
   fourth switch means connected between an output and said primary side of said booster capacitor; and
   an output terminal for outputting the potential of said primary side of said booster capacitor,
   said booster circuit further comprises a control circuit having an output which is connected to a control terminal of said first switch means,
   said control circuit comprising:
   a control capacitor, a primary side of said control capacitor being connected to said output of said control circuit;
   fifth switch means connected between the ground and said output of said control circuit,
   said control capacitor being charged during a precharge period of said memory device to apply a potential higher than the level of said power source to said output of said control circuit,
   said fifth switch means being turned on during an active period of said memory device to turn off said first switch means.

2. A booster circuit according to claim 1, wherein said booster capacitor and control capacitor are MOS capacitors.

3. A booster circuit according to claim 1, wherein said first to fifth switch means are MOS transistors.

4. A booster circuit according to claim 1, wherein said first to fifth switch means are MOS transistors, and said control terminal is a gate of said first switch means.

5. A booster circuit according to claim 1, wherein said control circuit further comprises initializing means for charging said control capacitor when the power on operation of said semiconductor memory device is performed.

6. A booster circuit according to claim 1, wherein said initializing means comprises an OR gate, said OR gate having an input to which a reset signal is supplied.

* * * * *